(12) United States Patent
Zhu et al.

(10) Patent No.: US 10,741,552 B2
(45) Date of Patent: Aug. 11, 2020

(54) METHOD AND DEVICE FOR EMBEDDING FLASH MEMORY AND LOGIC INTEGRATION IN FINFET TECHNOLOGY

(71) Applicant: GLOBALFOUNDRIES Singapore Pte. Ltd., Singapore (SG)

(72) Inventors: Ming Zhu, Singapore (SG); Pinghui Li, Singapore (SG); Su Yi Susan Yeow, Singapore (SG); Yiang Aun Nga, Singapore (SG); Danny Pak-Chum Shum, Singapore (SG); Eng Huat Toh, Singapore (SG)

(73) Assignee: GLOBALFOUNDERS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/040,105

(22) Filed: Jul. 19, 2018

(65) Prior Publication Data
US 2018/0374850 A1  Dec. 27, 2018

Related U.S. Application Data

(62) Division of application No. 15/631,757, filed on Jun. 23, 2017, now Pat. No. 10,163,901.

(51) Int. Cl.
*H01L 27/088* (2006.01)
*H01L 21/02* (2006.01)
*H01L 29/06* (2006.01)
*H01L 27/11536* (2017.01)

(52) U.S. Cl.
CPC .... *H01L 27/0886* (2013.01); *H01L 21/02326* (2013.01); *H01L 21/02332* (2013.01); *H01L 27/11536* (2013.01); *H01L 29/0642* (2013.01)

(58) Field of Classification Search
CPC ........... H01L 27/0886; H01L 21/02326; H01L 21/02332; H01L 29/0642
USPC ........................................................ 438/258
See application file for complete search history.

(56) References Cited

U.S. PATENT DOCUMENTS

2003/0040130 A1  2/2003 Mayur et al.
2017/0358592 A1*  12/2017 Yamaguchi ......... H01L 29/0847

* cited by examiner

*Primary Examiner* — Elias Ullah
(74) *Attorney, Agent, or Firm* — Ditthavong & Steiner P.C.

(57) ABSTRACT

Methods for preventing step-height difference of flash and logic gates in FinFET devices and related devices are provided. Embodiments include forming fins in flash and logic regions; recessing an oxide exposing an upper portion of the fins; forming an oxide liner over the upper portion in the flash region; forming a polysilicon gate over and perpendicular to the fins in both regions; removing the gate from the logic region and patterning the gate in the flash region forming a separate gate over each fin; forming an ONO layer over the gates in the flash region; forming a second polysilicon gate over and perpendicular to the fins in both regions; planarizing the second polysilicon gate exposing a portion of the ONO layer over the gates in the flash region; forming and patterning a hardmask, exposing STI regions between the flash and logic regions; and forming an ILD over the STI regions.

20 Claims, 13 Drawing Sheets

METHOD AND DEVICE FOR EMBEDDING FLASH MEMORY AND LOGIC INTEGRATION IN FINFET TECHNOLOGY

RELATED APPLICATION

The present application is a Divisional application of U.S. application Ser. No. 15/631,757, filed Jun. 23, 2017, which is incorporated herein by reference in its entirety.

TECHNICAL FIELD

The present disclosure relates to semiconductor processing. In particular, the present disclosure relates to fin field effect transistor (FinFET) fabrication in the 14 nanometer (nm) technology node and beyond.

BACKGROUND

In conventional FinFETs, the horizontal channel is positioned on a vertical sidewall within the fin. Flash cell floating gate (FG) and control gate (CG) need to be positioned at the sides of the fin. The flash cell total gate height is higher than the logic gate and leads to processing challenges. In particular, a higher FG height than the logic metal gate leads to challenges with metal gate chemical mechanical planarization (CMP), especially for gate-last replacement metal gate (RMG) processing.

A need therefore exists for methodology enabling elimination of the step-height difference of flash and logic gates and the related device.

SUMMARY

An aspect of the present disclosure is to integrate FG and CG into a three-dimensional (3D) FinFET structure. The present disclosure provides a solution for integrating embedded non-volatile memory (eNVM) into a FinFET process flow. Although an eNVM cell includes both FG and CG, the present disclosure provides a structure with a total gate height being kept the same as the logic device which only has one gate, such that the RMG process will not be affected. With the present disclosure the FG wraps around the fin to store the charge, while the CG is located at a sidewall of the FG to control the channel. Another aspect of the present disclosure includes providing the flexibility of making the CG either a polysilicon gate or metal gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming fins in flash and logic regions of a substrate; recessing an oxide layer exposing an upper portion of the fins; forming an oxide liner over the upper portion of the fins in the flash region; forming a first polysilicon gate over and perpendicular to the fins in the flash and logic regions; removing the first polysilicon gate from the logic region and patterning the first polysilicon gate in the flash region forming a separate polysilicon gate over each fin in the flash region; forming an oxide nitride oxide (ONO) layer over the polysilicon gates in the flash region; forming a second polysilicon gate over and perpendicular to the fins in the flash and logic regions; planarizing the second polysilicon gate exposing a portion of the ONO layer over the polysilicon gates in the flash region; forming a hardmask and patterning the hardmask, exposing shallow trench isolation (STI) regions between the flash and logic regions; and forming an interlayer dielectric (ILD) over the STI regions.

Aspects of the present disclosure include forming the ONO layer over the polysilicon gates in the flash region and over the fins in the logic region; and removing the ONO from the logic region. Other aspects include CMP of the ILD exposing an upper surface of the second polysilicon gate in the logic region and the portion of the ONO layer over the polysilicon gates in the flash region. Yet other aspects include replacing each second polysilicon in the logic region with a RMG. Additional aspects include replacing each second polysilicon in the logic region with an RMG by forming a metal gate over the fins in the logic region. Another aspect includes planarizing the second polysilicon gate with CMP, wherein the first polysilicon gates in the flash region are coplanar with the second polysilicon gate. An additional aspect includes, after recessing the oxide layer, forming the STI regions in the oxide layer along sides of the fins. Other aspects include replacing the second polysilicon gates with RMGs. In certain aspects forming a control gate of the RMGs in the flash region; and forming two flash gates of the first polysilicon gates in the flash region which share the control gate.

Another aspect of the present disclosure is method including recessing an oxide layer exposing an upper portion of fins formed in a substrate; forming an oxide liner over the upper portion of the fins in the flash region; forming a first polysilicon gate over and perpendicular to the fins in the flash and logic regions; removing the first polysilicon gate from the logic region and patterning the first polysilicon gate in the flash region forming a separate polysilicon gate over each fin in the flash region; forming an ONO layer over the polysilicon gates in the flash region; forming a second polysilicon gate over and perpendicular to the fins in the flash and logic regions; planarizing the second polysilicon gate exposing a portion of the ONO layer over the polysilicon gates in the flash region; forming a hardmask and patterning the hardmask, exposing STI regions and the oxide layer in the flash and logic regions; forming an ILD over the STI regions and the oxide layer; and removing the second polysilicon gate from the flash and logic regions.

Aspects include a forming the ONO layer over the polysilicon gates in the flash region and over the fins in the logic region; and removing the ONO from the logic region. Other aspects include CMP of the ILD exposing an upper surface of the second polysilicon gate in the logic region and the portion of the ONO layer over the polysilicon gates in the flash region. Additional aspects include forming a metal gate over the fins in the logic region and between the first polysilicon gates in the flash region. Other aspects include forming a metal control gate in the flash region, wherein the metal control gate in the flash region shares the same metal with the metal gate in the logic region. Yet other aspects include CMP of the metal control gate in the flash region and the metal gate in the logic region.

Yet another aspect of the present disclosure includes a device having Si fins formed in flash and logic regions of a substrate; an oxide liner formed over an upper portion of the fins in the flash region; first polysilicon gates formed over the oxide liner in the flash region; an ONO layer formed over the first polysilicon gates in the flash region; a control gate formed between the first polysilicon gates in the flash region; and a metal gate formed over the fins in the logic region, wherein the first polysilicon gates in the flash region are flash gates, and they share the control gate.

Aspects include the first polysilicon gates in the flash region being coplanar with the control gate in the flash region, and the control gate being formed of polysilicon and being self-aligned between the first polysilicon gates in the flash region. Other aspects include the polysilicon control gate being formed over a portion of the ONO layer between the first polysilicon gates in the flash region. Another aspect includes the first polysilicon gates in the flash region being coplanar with the control gate in the flash region, and the control gate being formed of metal and being self-aligned between the first polysilicon gates in the flash region. Yet another aspect includes the metal control gate being formed over a high-k dielectric layer and a portion of the ONO layer between the first polysilicon gates in the flash region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of step-height difference of flash and logic gates in FinFET devices. The present disclosure eliminates the step-height difference for FinFET devices, especially for gate-last replacement metal gate (RMG) processing.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
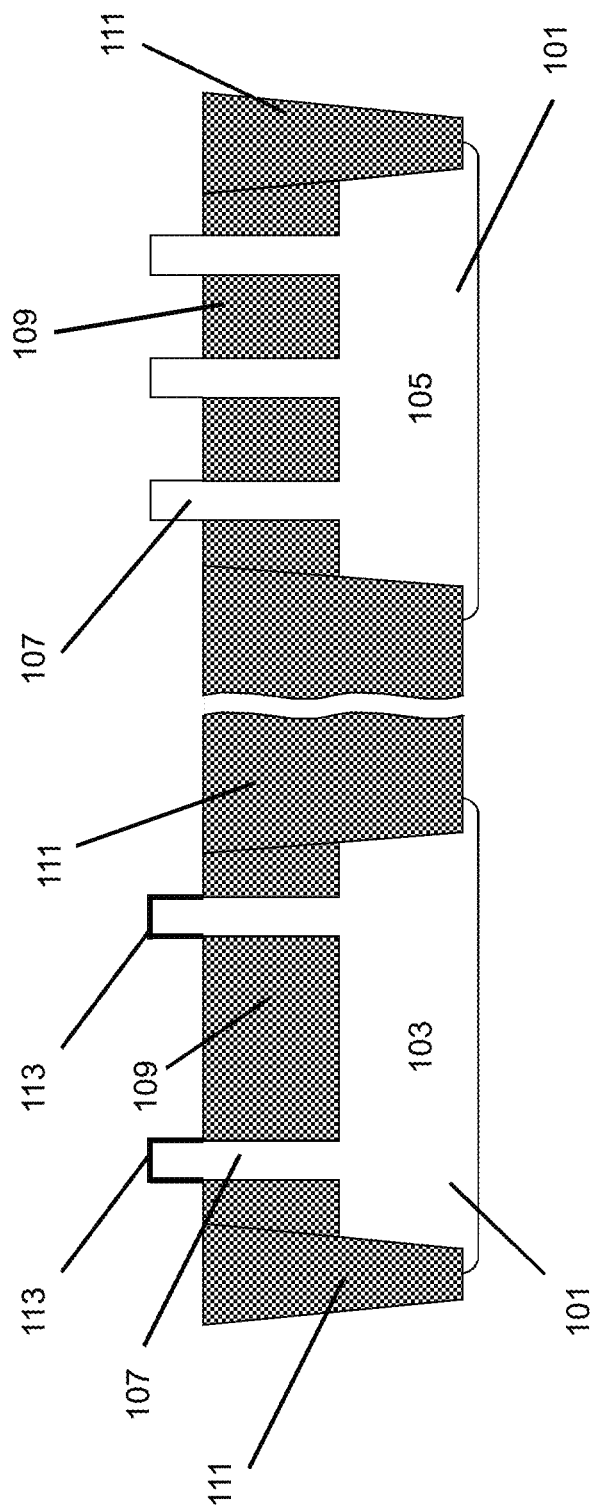
FIGS. 1 through 10 illustrate a process flow for producing a FinFET structure, in accordance with an exemplary embodiment.

FIG. 1 illustrates, in a cross section view along the gate, a substrate 101 including a flash region 103 and a logic region 105. Silicon (Si) fins 107 are formed of the substrate 101. Oxide 109 is recessed to reveal an upper portion of the fins 107. STI regions 111 are formed to prevent electric current leakage between adjacent semiconductor device components, including the flash region 103 and a logic region 105. A tunnel oxide liner 113 is grown over the fins 107, but is removed from the logic region 105. The tunnel oxide liner is grown by a thermal oxidation process to a thickness of 5 to 10 nm.

Figure 2:
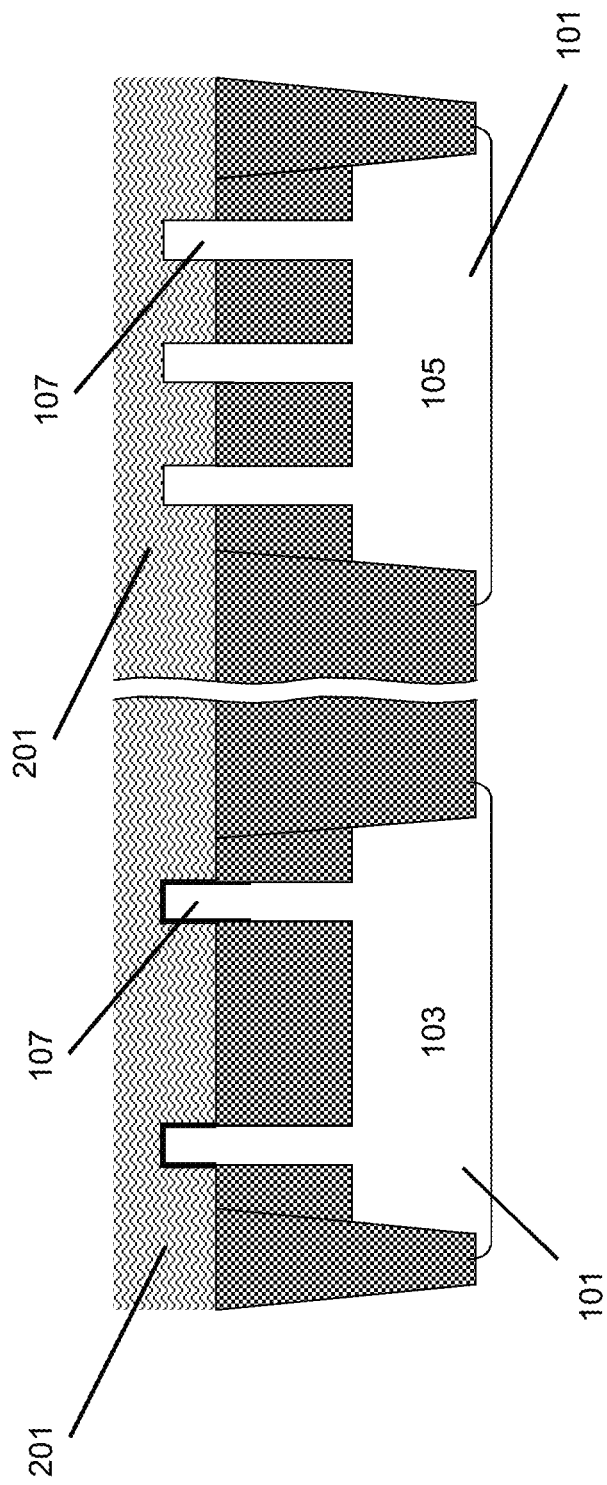
Figure 3:
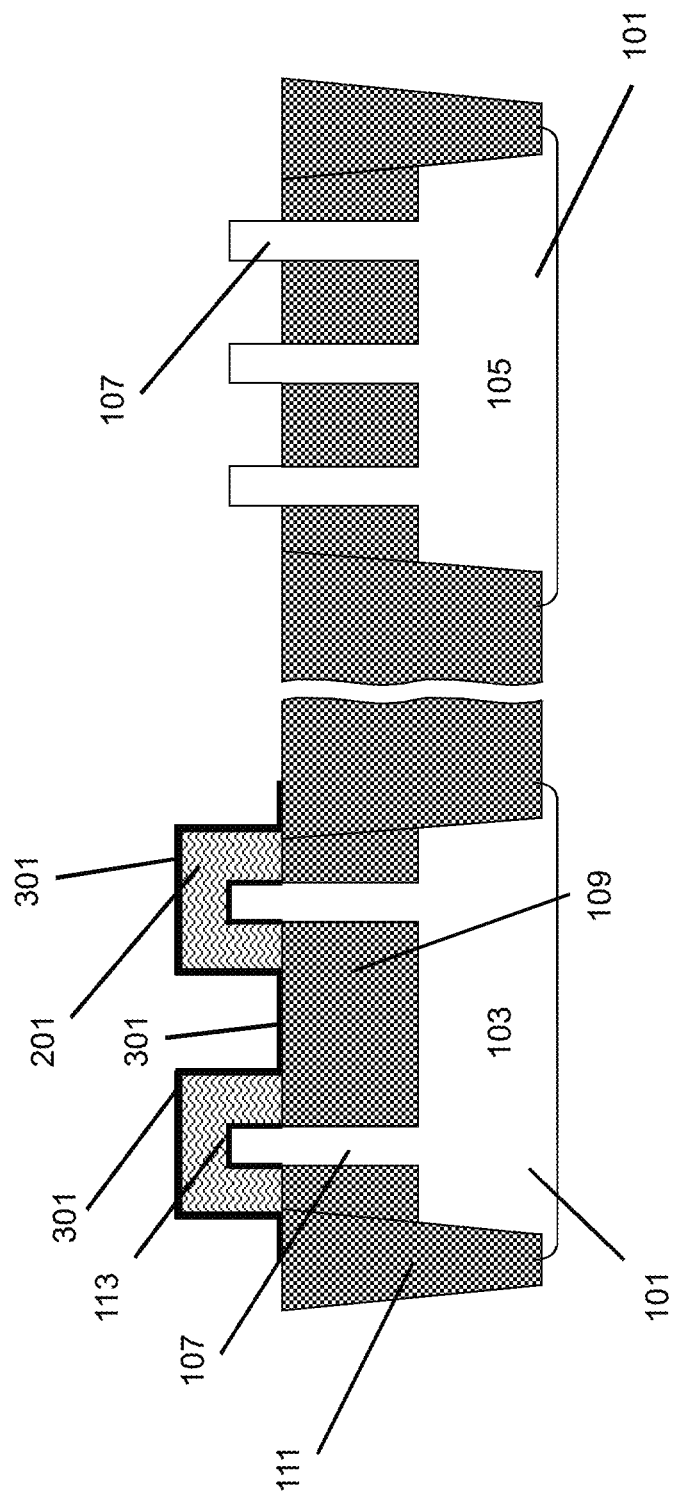

In FIG. 2, a floating polysilicon gate 201 is deposited over the substrate in the flash region 103 and the logic region 105 and planarized by CMP to a thickness of 50 to 70 nm. In FIG. 3, the floating polysilicon gate 201 is patterned such that it remains over the fins 107 in the flash region 103 and is removed from the logic region 105. An ONO layer 301 is deposited over the substrate 101 in the flash region 103 and the logic region 105. The ONO layer 301 is removed from the logic region 105 and remains over the floating polysilicon gate 201, portions of the STI regions 111 and oxide layer 109 in the flash region 103. The ONO layer 301 is formed to a thickness of 15 to 20 nm.

Figure 4:
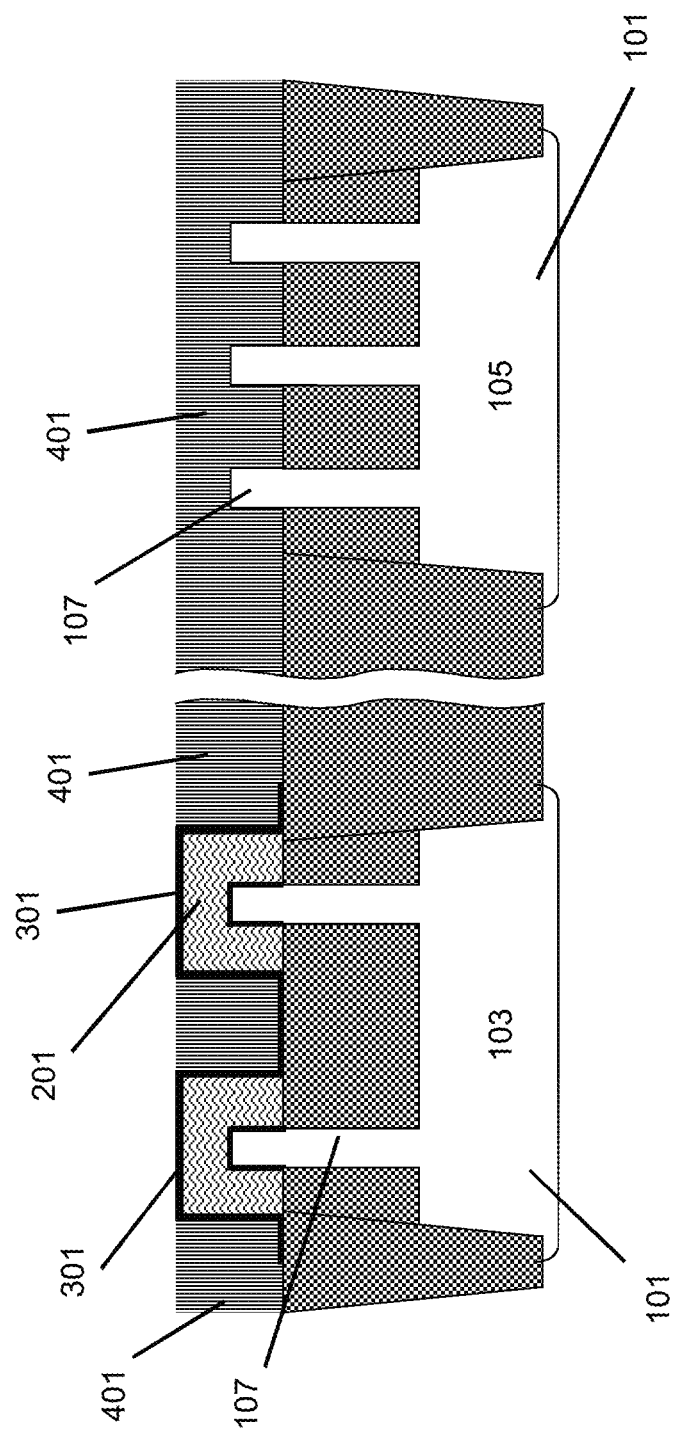

Adverting to FIG. 4, a polysilicon gate 401 is deposited over the substrate 101 in the flash region 103 and the logic region 105 and planarized by CMP. The polysilicon gate 401 is formed over and perpendicular to the fins 107 in the flash region 103 and logic region 105 and is to be used by both a flash CG and a logic gate. The CMP step polishes the polysilicon gate 401 down to a portion of the ONO layer 301 and the height of the polysilicon gate 401 in the flash region 103 is coplanar with the polysilicon gate 401 in the logic region 105.

Figure 5:
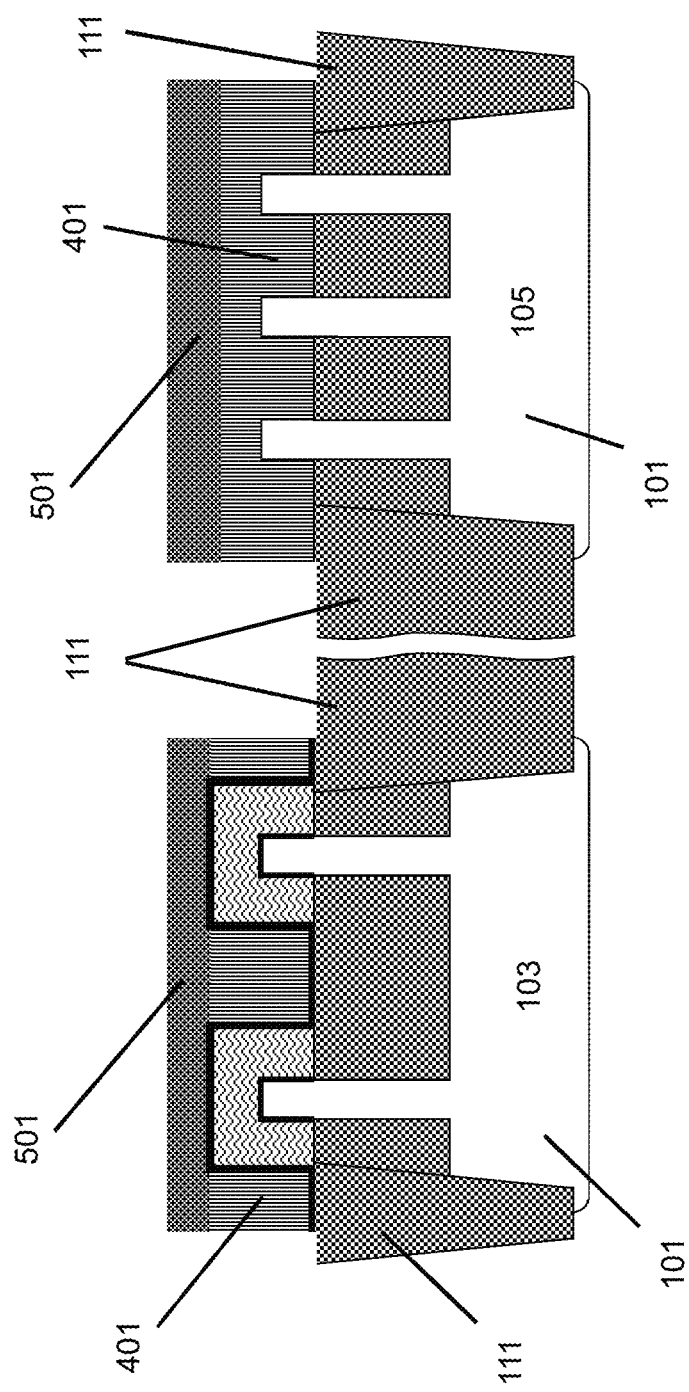
Figure 6:
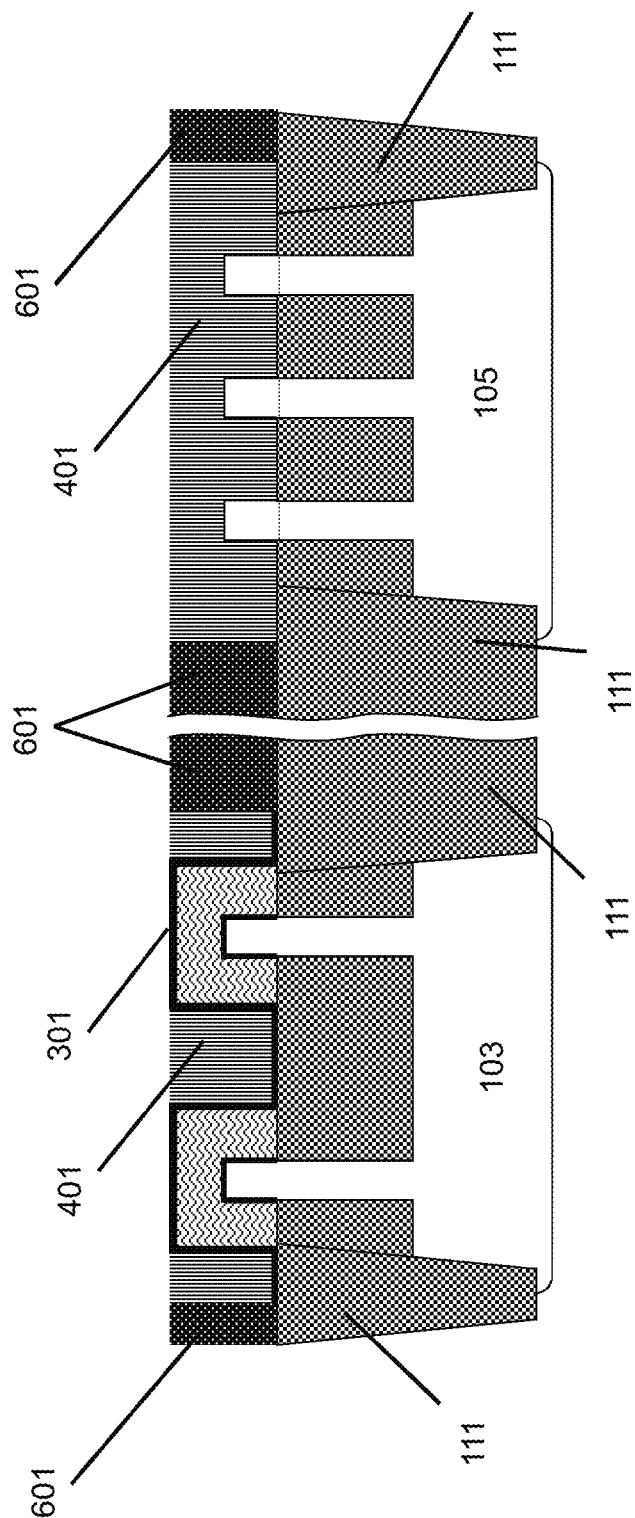

In FIG. 5, a hardmask 501 is formed over the substrate 101. The hardmask 501 is then patterned exposing STI regions 111 between the flash region 103 and logic region 105. As shown in FIG. 6, an ILD 601 is formed over the STI regions 111. The ILD 601 is planarized by CMP to expose an upper surface of the second polysilicon gate 401 in the flash region 103 and logic region 105. A portion of the ONO layer 301 is exposed after the CMP in the flash region 103.

Figure 7:
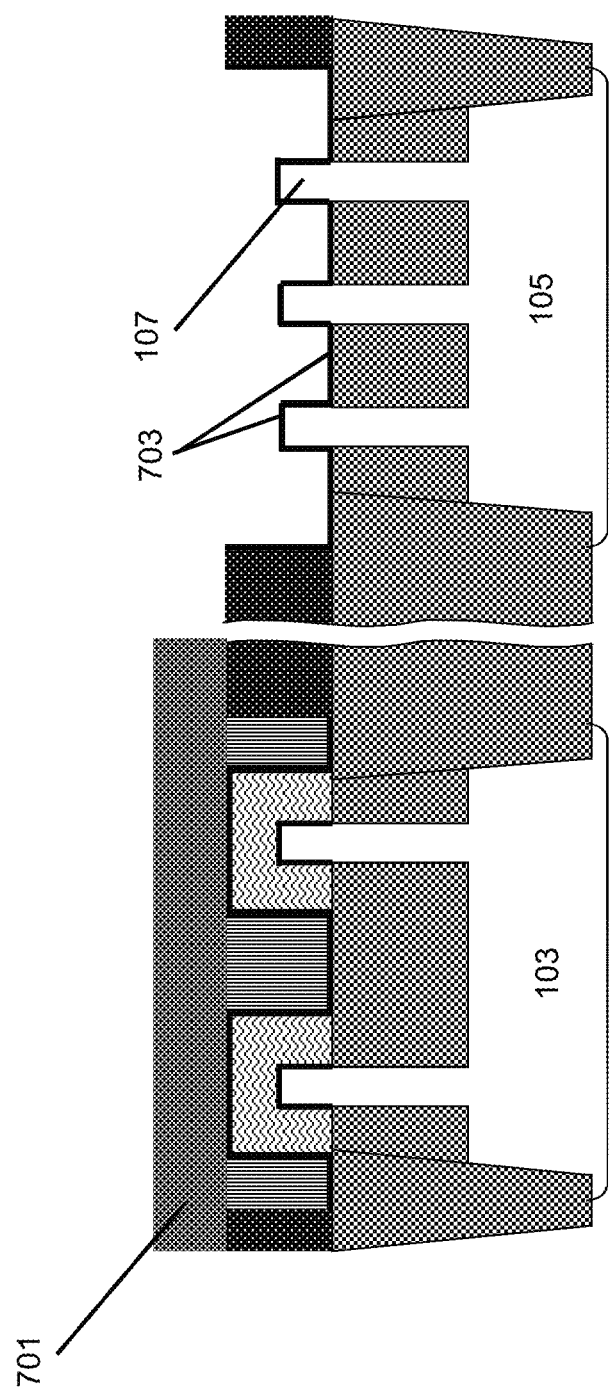
Figure 8:
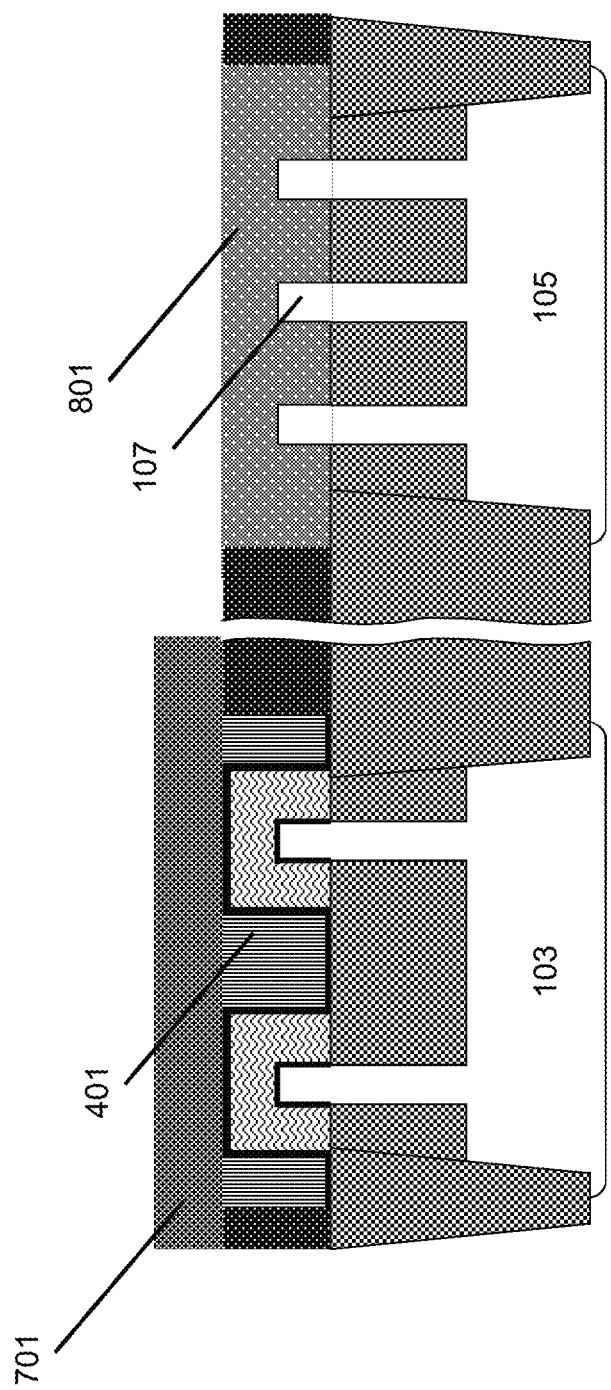

Adverting to FIG. 7, a photoresist (PR) 701 is formed over the flash region 103, and the polysilicon gate 401 is removed from the logic region 105, exposing the upper portion of the fins 107 in the logic region 105. The flash region 103 is protected by the PR during removal of the second polysilicon gate 401. Thus, the polysilicon gate 401 in the flash region 103 remains and serves as the CG of the flash region 103. A high-K dielectric liner 703 is disposed over and between the fins 107 in the logic region 105. In FIG. 8, a RMG 801 is formed over and perpendicular to the fins 107 in the logic region 105. The RMG 801 is then planarized by CMP.

Figure 9:
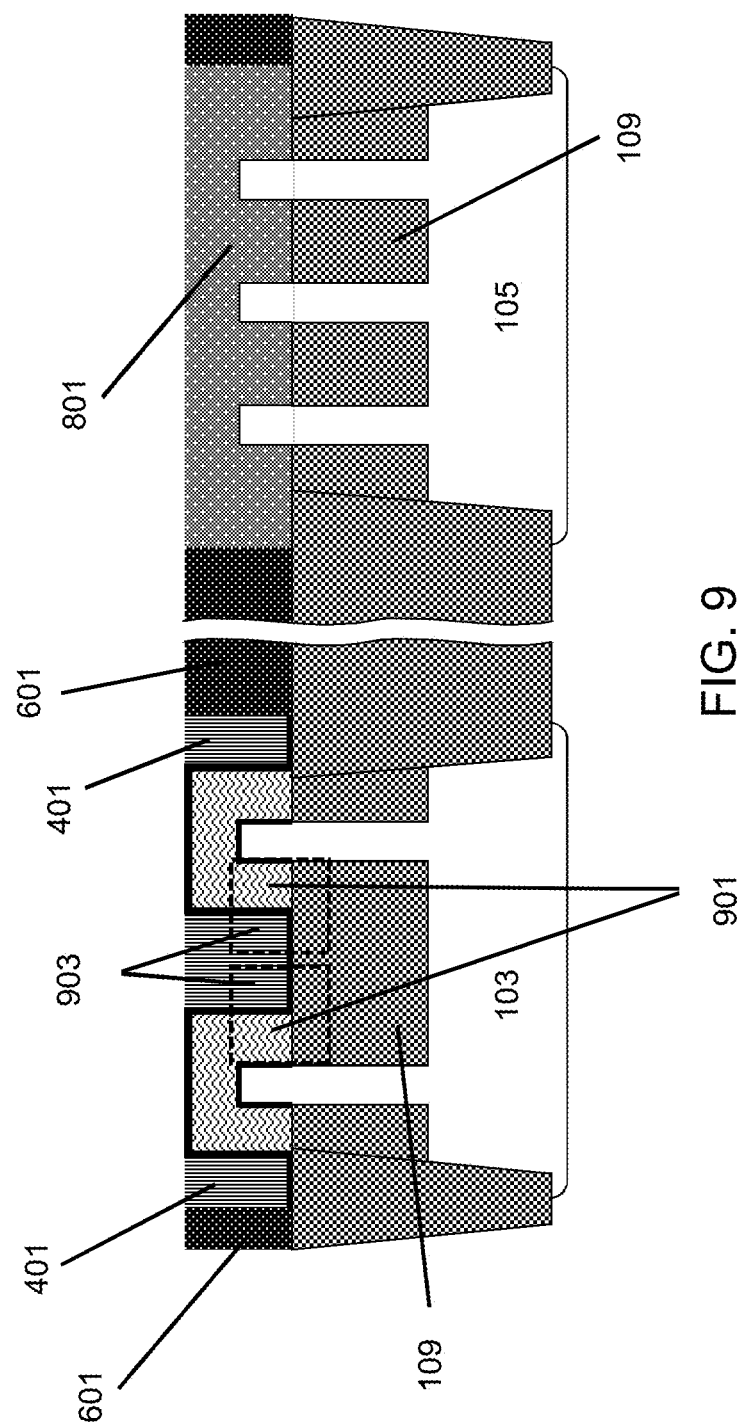

FIG. 9 is a completed FinFET device, after PR 701 is removed, according to a first embodiment. Both FGs 901 share the same CG 903, but with different channels. The overall FG height in the flash region 103 is coplanar with the logic gate height in the logic region 105. The CG 903 self-aligns in between the FGs 901. The FinFET structure of this first embodiment resolves the step-height difference of the flash and logic gates.

Figure 10:
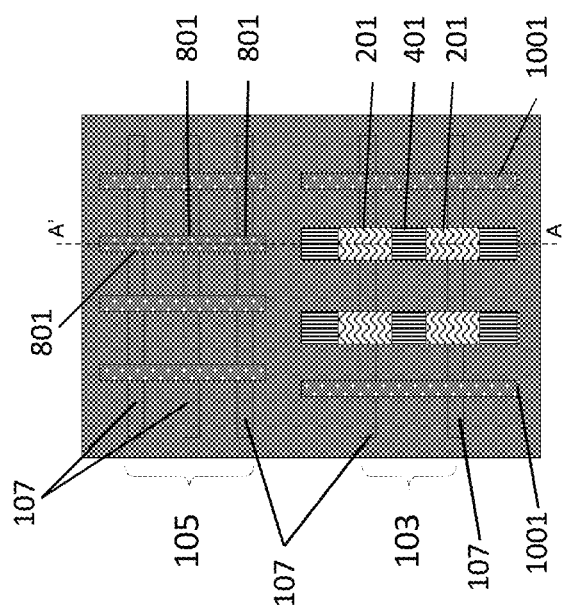

FIG. 10 is a top view of FIG. 9. FIG. 9 is a cross-sectional view along line A-A' of FIG. 10. In FIG. 10, plural RMGs 801 are formed over and perpendicular to the fins 107 in the logic region 105. The floating polysilicon gates 201 are formed over and perpendicular to the fins 107 in the flash region 103. The polysilicon gate 401 in the flash region 103 serves as the CG of the flash region 103. Metal select gates 1001 are shown in top view of FIG. 10 in the flash region 103.

Figure 11:
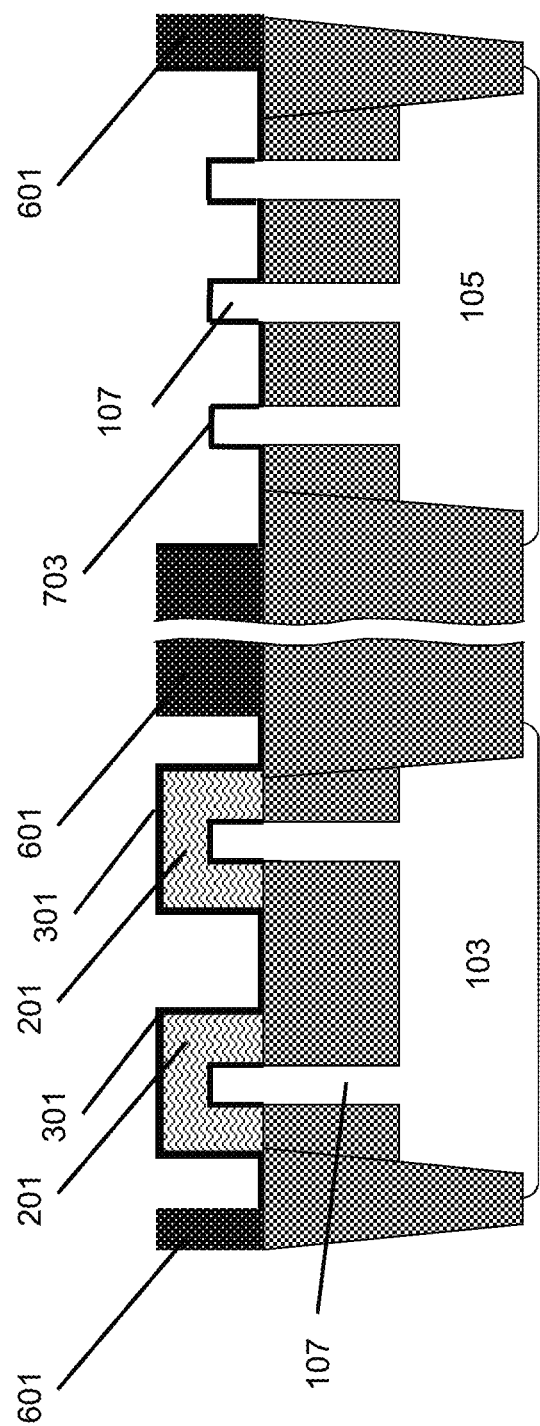
FIGS. 11 through 13 illustrate a process flow for producing a FinFET structure, in accordance with another exemplary embodiment.
Figure 12:
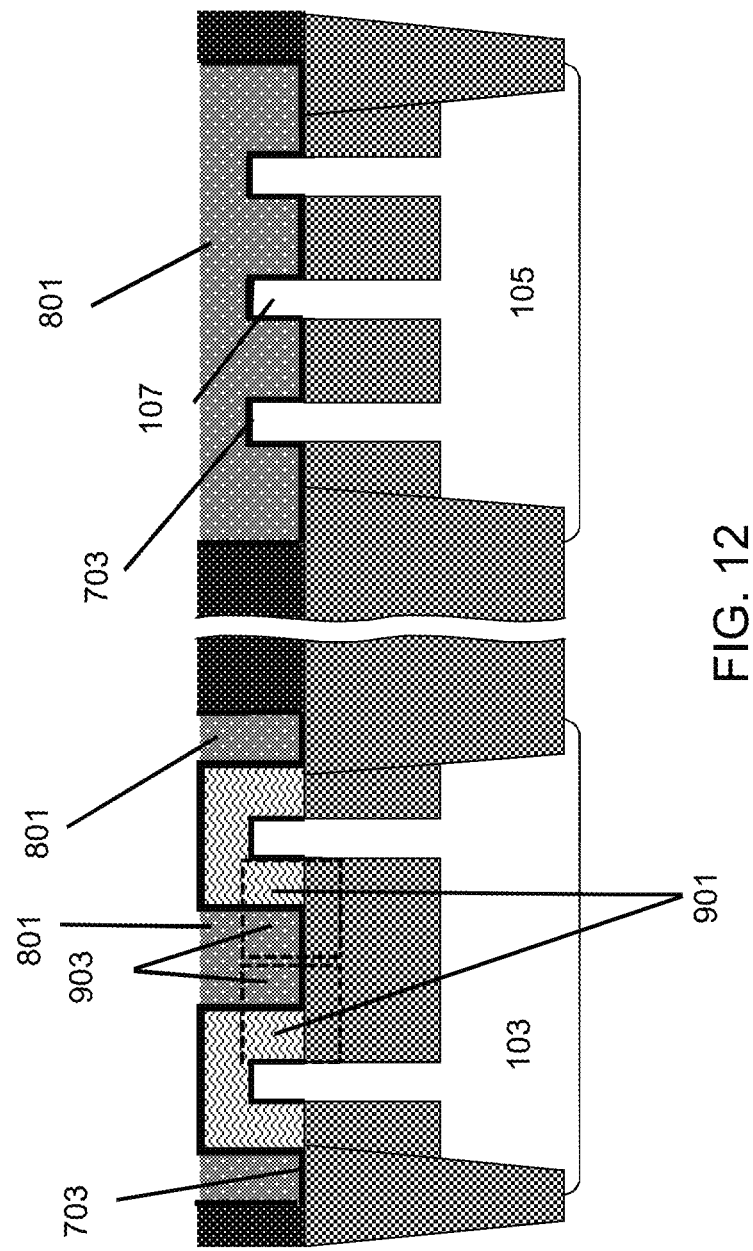
Figure 13:
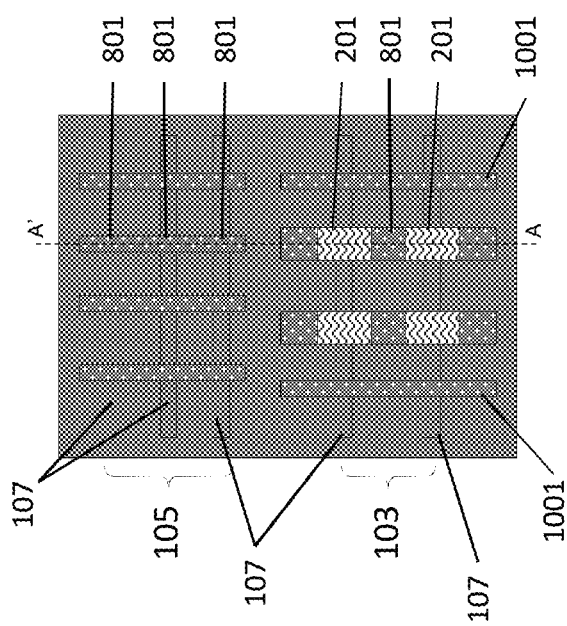

FIGS. 11, 12 and 13 illustrate the process flow for another embodiment of the present disclosure. The second embodiment follows the process of the first embodiment through FIG. 6. However, the polysilicon gate 401 from FIG. 6 is shown removed from both the flash region 103 and logic region 105 in FIG. 11. A high-K dielectric liner 703 is disposed in the flash region 103 and logic region 105 where RMG is to occur. In FIG. 12, the RMG 801 is formed over the high-K dielectric liner 703 in the flash region 103 and the logic region 105. The RMG 801 is then planarized by CMP. The overall FG height in the flash region 103 is coplanar with the logic gate height in the logic region 105. As with FIG. 9, both FGs 901 in FIG. 12 share the same CG 903, but with different channels. The overall FG height in the flash region 103 is coplanar with the logic gate height in the logic region 105. The CG 903 self-aligns in between the FGs 901. With the second embodiment, the CG in the flash region 103 is the same RMG as in the logic region 105. The FinFET structure of this second embodiment resolves the step-height difference of the flash and logic gates.

FIG. 13 is a top view of FIG. 12. FIG. 12 is a cross-sectional view along line A-A' of FIG. 13. In FIG. 13, plural RMGs 801 are formed over and perpendicular to the fins 107 in the flash region 103 and logic region 105. The floating polysilicon gates 201 are formed over and perpendicular to the fins 107 in the flash region 103. Metal select gates 1001 are shown in top view of FIG. 13 in the flash region 103.

The embodiments of the present disclosure can achieve several technical effects, including embedding NVM and logic integration in FinFET technology, with uniform gate heights in the flash and logic regions, and in particular gate-last RMG processing in FinFET technology. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of FinFET devices, particularly in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   silicon (Si) fins formed in flash and logic regions of a substrate;
   an oxide liner formed over an upper portion of the fins in the flash region;
   a first polysilicon gate and a second polysilicon gate formed over the oxide liner in the flash region;
   an oxide nitride oxide (ONO) layer formed over the first and second polysilicon gates in the flash region, wherein the ONO continuously extends between the first polysilicon gate and the second polysilicon gate in the flash region when viewed in cross section;
   a control gate formed between the first and second polysilicon gates in the flash region; and
   a metal gate formed over the fins in the logic region, wherein the first and second polysilicon gates in the flash region are flash gates and they share the control gate.

2. The device according to claim 1, wherein the first and second polysilicon gates in the flash region are coplanar with the control gate in the flash region.

3. The device according to claim 2, wherein the control gate is formed of polysilicon and is self-aligned between the first and second polysilicon gates in the flash region.

4. The device according to claim 3, wherein the polysilicon control gate is formed over a portion of the ONO layer between the first and second polysilicon gates in the flash region.

5. The device according to claim 1, wherein the first and second polysilicon gates in the flash region are coplanar with the control gate in the flash region.

6. The device according to claim 5, wherein the control gate is formed of metal and is self-aligned between the first and second polysilicon gates in the flash region.

7. The device according to claim 6, wherein the metal control gate is formed over a high-k dielectric layer and a portion of the ONO layer between the first and second polysilicon gates in the flash region.

8. A device comprising:
   fins formed in flash and logic regions of a substrate;
   an oxide liner formed over an upper portion of the fins in the flash region;
   a first polysilicon flash gate and a second polysilicon flash gate formed over the oxide liner in the flash region;
   an oxide nitride oxide (ONO) layer formed over the first and second polysilicon flash gates in the flash region, wherein the ONO continuously extends between the first polysilicon flash gate and the second polysilicon flash gate when viewed in cross section;
   a control gate formed between the first and second polysilicon flash gates in the flash region; and
   a metal gate formed over the fins in the logic region.

9. The device according to claim 8, wherein the first and second polysilicon flash gates share the control gate.

10. The device according to claim 8, wherein the first and second polysilicon gates in the flash region are coplanar with the control gate in the flash region.

11. The device according to claim 10, wherein the control gate is formed of polysilicon and is self-aligned between the first and second polysilicon gates in the flash region.

12. The device according to claim 11, wherein the polysilicon control gate is formed over a portion of the ONO layer between the first and second polysilicon gates in the flash region.

13. The device according to claim 8, wherein the first and second polysilicon gates in the flash region are coplanar with the control gate in the flash region.

14. The device according to claim 13, wherein the control gate is formed of metal and is self-aligned between the first and second polysilicon gates in the flash region.

15. The device according to claim 14, wherein the metal control gate is formed over a high-k dielectric layer and a portion of the ONO layer between the first and second polysilicon gates in the flash region.

16. A device comprising:
a first polysilicon flash gate and a second polysilicon flash gate formed in a flash region;
an oxide nitride oxide (ONO) layer formed over the first and second polysilicon flash gates in the flash region;
a control gate formed between the first and second polysilicon flash gates in the flash region; and
a metal gate formed in the logic region,
wherein the ONO continuously extends between the first polysilicon flash gate and the second polysilicon flash gate when viewed in cross section.

17. The device according to claim 16, wherein the first and second polysilicon flash gates, control gate and metal gate are formed over silicon fins.

18. The device according to claim 17, further comprising:
an oxide liner formed over an upper portion of the silicon fins in the flash region.

19. The device according to claim 16, wherein:
the polysilicon control gate is formed over a portion of the ONO layer between the first and second polysilicon flash gates in the flash region,
the first and second polysilicon flash gates in the flash region are coplanar with the control gate in the flash region, and
the control gate is formed of metal and is self-aligned between the first and second polysilicon flash gates in the flash region.

20. The device according to claim 19, wherein the metal control gate is formed over a high-k dielectric layer and a portion of the ONO layer between the first and second polysilicon flash gates in the flash region.

* * * * *